(12) United States Patent
Tanaka et al.

(10) Patent No.: US 7,276,792 B2
(45) Date of Patent: Oct. 2, 2007

(54) SEMICONDUCTOR DEVICE, CIRCUIT SUBSTRATE, ELECTRO-OPTIC DEVICE AND ELECTRONIC APPLIANCE

(75) Inventors: Shuichi Tanaka, Chino (JP); Haruki Ito, Chino (JP); Yasuhito Aruga, Matsumoto (JP); Ryohei Tamura, Chino (JP); Michiyoshi Takano, Okaya (JP)

(73) Assignee: Seiko Epson Corporation (JP)

( * ) Notice: Subject to any disclaimer, the term of this patent is extended or adjusted under 35 U.S.C. 154(b) by 142 days.

(21) Appl. No.: 11/128,848

(22) Filed: May 13, 2005

(65) Prior Publication Data

US 2005/0275115 A1 Dec. 15, 2005

(30) Foreign Application Priority Data

Jun. 14, 2004 (JP) ............................ 2004-175534

(51) Int. Cl.
*H01L 23/48* (2006.01)
(52) U.S. Cl. ................ 257/737; 257/688; 257/E23.021
(58) Field of Classification Search ................ 257/734, 257/737, 678, 738, E23.021, E23.069, E21.508, 257/688, 689
See application file for complete search history.

(56) References Cited

U.S. PATENT DOCUMENTS 4,813,129 A 3/1989 Karnezos 6,097,091 A 8/2000 Ohsumi
7,057,283 B2 * 6/2006 Inoue et al. ................. 257/737

FOREIGN PATENT DOCUMENTS

| JP | 02-272737 | 11/1990 |
|---|---|---|
| JP | 2552902 | 8/1996 |
| JP | 10-321631 | 12/1998 |
| JP | 11-67776 | 3/1999 |
| JP | 2001-110831 | 4/2001 |
| JP | 2001-127256 | 5/2001 |
| JP | 2002-280484 | 9/2002 |
| JP | 2004-186333 | 7/2004 |

OTHER PUBLICATIONS

Communication from Japanese Patent Office regarding corresponding application.

* cited by examiner

*Primary Examiner*—Howard Weiss
*Assistant Examiner*—(Vikki) Hoa B. Trinh
(74) *Attorney, Agent, or Firm*—Harness, Dickey & Pierce, P.L.C.

(57) ABSTRACT

A semiconductor device in the first embodiment includes: an electrode pad and a resin projection, formed on an active surface; a conductive film deposited from a surface of the electrode pad to a surface of the resin projection; a resin bump formed with the resin projection and with the conductive film. The semiconductor device is conductively connected to the opposing substrate through the resin bump electrode. The testing electrode is formed with the conductive film that is extended and applied to the opposite side of the electrode pad across the resin projection.

12 Claims, 8 Drawing Sheets

SEMICONDUCTOR DEVICE, CIRCUIT SUBSTRATE, ELECTRO-OPTIC DEVICE AND ELECTRONIC APPLIANCE

RELATED APPLICATIONS

This application claims priority to Japanese Patent Application No. 2004-175534 filed Jun. 14, 2004 which is hereby expressly incorporated by reference herein in its entirety.

BACKGROUND

1. Technical Field

The present invention relates to a semiconductor device, a circuit substrate, an electro-optic device, and an electronic appliance.

2. Related Art

A semiconductor device such as an Integrated Circuit chip, etc. is mounted on a substrate of a circuit substrate or a liquid crystal display device that is mounted on various kinds of electronic appliances. For example, in a liquid crystal display device, an IC chip for driving liquid crystal designed to drive a liquid crystal panel is mounted on the glass substrate (opposing substrate) that composes the liquid crystal panel (so called Chip On Glass structure). When mounting the IC chip using a hard silicon substrate on a hard glass substrate, it is difficult to absorb the warpage of the IC chip as well as the glass substrate. Therefore, bump (projection) electrodes are formed on the IC chip, and the IC chip and the glass substrate are conductively connected by mounting the bump electrodes on the glass substrate while squashing them.

In recent years, there has been an increasing demand for smaller sized IC chips, while the number of IC chip terminals has increased as the liquid crystal display devices are achieving a highly integrated quality. Thus, there is a need to narrow the bump electrode pitch formed on the IC chip. It has been a usual practice to form bump electrodes by depositing an Au electroplate on a resist opening. Therefore, in order to narrow the pitch of bump electrodes, there has been a need to increase the aspect ratio of the resist opening. Hence, with known bump electrodes, it has been difficult to cope with the narrowing of the bump electrode pitch.

As a solution, a resin bump electrode 10 as shown in FIG. 9 has been developed. The resin bump electrode 10 has a conductive film 20 on the surface of a resin projection 12, where the conductive film 20 is connected to an electrode pad 24 of an IC chip 21. For example, refer to Japanese Unexamined Patent Publication No. H2-272737. When this resin bump electrode 10 touches the opposing substrate, the resin projection 12 deforms itself elastically. Hence the warpage of the IC chip 21 as well as of the opposing substrate can be absorbed. Moreover, there is no need to have a large aspect ratio, thus it is possible to cope with the narrowing of the bump electrode pitch.

The operation check of electronic elements (not shown) such as transistor and the like that compose the IC chip 21, as well as the conductive connectivity check of those electronic elements, are performed by having a test probe contact the top part of the bump electrode.

However, contacting the top part of the bump electrode with the test probe involves the problem of the top part thereof being scratched off.

A known bump electrode is formed to have an adequate thickness with an Au electroplate. Hence, even when the top part of the bump electrode is scratched off by the contact with the test probe, the conductive connection between the bump electrode and the opposing substrate is severed. In contrast, in the case of the resin bump electrode 10, the conductive film 20 on the surface of the resin projection 12 is formed to be excessively thin. Because of this reason, when the conductive film 20 on the resin bump electrode 10 is scratched off by the contact with the test probe, the conductive connection between the resin bump electrode 10 and the opposing substrate may not be possible.

The solution could be that a testing part is set between the electrode pad 24 and the resin bump electrode 10, and various tests be performed by having the test probe contact the conductive film 20 on the testing part. Yet, in this case, it is not possible to test the entire conductive connectivity status from the electrode pad 24 to the resin bump electrode 10. Even worse, if the conductive film 20 is scratched off at the testing part by the contact with the test probe, the conductive connection between the electrode pad 24 and the resin bump electrode 10 may be cut off.

On the active surface of the semiconductor device, an insulation film 26 composed of brittle material such as silicon oxide, silicon nitride and the like is formed, and on the insulation film 26, the conductive film 20 is formed. Hence, if the test probe contacts the conductive film 20 at the testing part, the insulation film 26 composed of brittle material may be damaged by the shock of the contact.

In order to solve the aforementioned problems, the present invention aims to provide a semiconductor device that enables to prevent the damage from testing, as well as to secure a conductive connection with the opposing substrate.

Furthermore, the invention also aims to provide a circuit substrate, an electro-optic device, and an electronic appliance, that have a highly reliable conductive connection.

SUMMARY

In order to achieve the above, a device according to an aspect of the invention includes: an electrode pad and a resin projection formed on an active surface; a conductive film deposited from a surface of the electrode pad to a surface of the resin projection; wherein the semiconductor device is conductively connected to an opposing substrate via the conductive film deposited on the surface of the resin projection; and a testing electrode formed with the conductive film extended and applied from the electrode pad to the opposite side across the resin projection.

With this structure, the resin bump electrode, which serves as the conductive connection part to the opposing substrate, is formed with the resin projection and the conductive film on the surface thereon. The testing electrode is formed in the opposite side of the electrode pad across that resin bump electrode, thus by having the test probe contact the testing electrode, the conductive connectivity check between the resin bump electrode and the electrode pad can be performed easily. Moreover, even when part of the conductive film that composes the testing electrode is scratched off by the contact with the test probe, there is no effect to the conductive function of the semiconductor device. Thus, it is possible to secure a conductive connection with the opposing substrate.

Moreover, a device according to another aspect of the invention includes: an electrode pad and a resin projection formed on an active surface; a conductive film deposited from a surface of the electrode pad to a surface of the resin projection; wherein the semiconductor device is conductively connected to an opposing substrate via the conductive film deposited on the surface of the resin projection; a resin layer formed on the active surface, and a testing electrode formed with the conductive film, that is extended and applied from the electrode pad to the opposite side across the resin projection as well as deposited on the surface of the resin layer.

With this structure, as in the above, the conductive connectivity check between the resin bump electrode and the electrode pad can be performed easily, and the conductive connection with the opposing substrate can be secured. Additionally, the testing electrode is formed on the surface of the elastic resin layer. Hence it is possible to protect the active surface of the semiconductor device from the shock caused by the contact between the testing electrode and the test probe.

It is desirable that the resin projection be formed on the surface of the resin layer. With this structure, the active surface of the semiconductor device is flattened by the resin layer, thus it is possible to form the resin projection with a high precision of height. By composing the resin bump electrode using this resin projection, it is possible to secure a conductive connection with the opposing substrate.

It is desirable that the resin projection and the resin layer both be formed with the same resin material.

With this structure, the resin projection and the resin layer adhere to each other, hence it is possible to improve the reliability of the resin bump electrode, as well as to secure a conductive connection with the opposing substrate.

Further, it is desirable that the resin projection and/or the resin layer be composed with a photosensitive resin.

With this structure, since the resin projection and/or the resin layer can be formed with a high precision, it is possible to securely make the opening at the electrode pad.

It is desirable that the conductive film be formed with a spattering method, and is patterned by an etching method.

With this structure, since it is possible to form the conductive film with ease, the manufacturing cost can be reduced.

It is desirable that a reinforcement material for the conductive film be formed on the surface of the conductive film with a conductive material.

With this structure, it is possible to protect the conductive film with the reinforcement material, as well as to reduce the electronic resistance of the conductive film. Consequently, the conductive connection with the opposing substrate can be secured.

The circuit substrate in the present invention is mounted with the semiconductor device according to any of claim 1 through claim 7.

With this structure, it is possible to provide the highly reliable circuit substrate.

Furthermore, the electro-optic device in the present invention is composed with the above-mentioned semiconductor device or the aforementioned circuit substrate.

With this structure, it is possible to provide the electro-optic device with a highly reliable conductive connection.

Moreover, the electronic appliance in the present invention is composed with the above-mentioned circuit substrate or the aforementioned electro-optic device.

With this structure, it is possible to provide the electronic appliance with a highly reliable conductive connection.

DETAILED DESCRIPTION

Figure 1A:
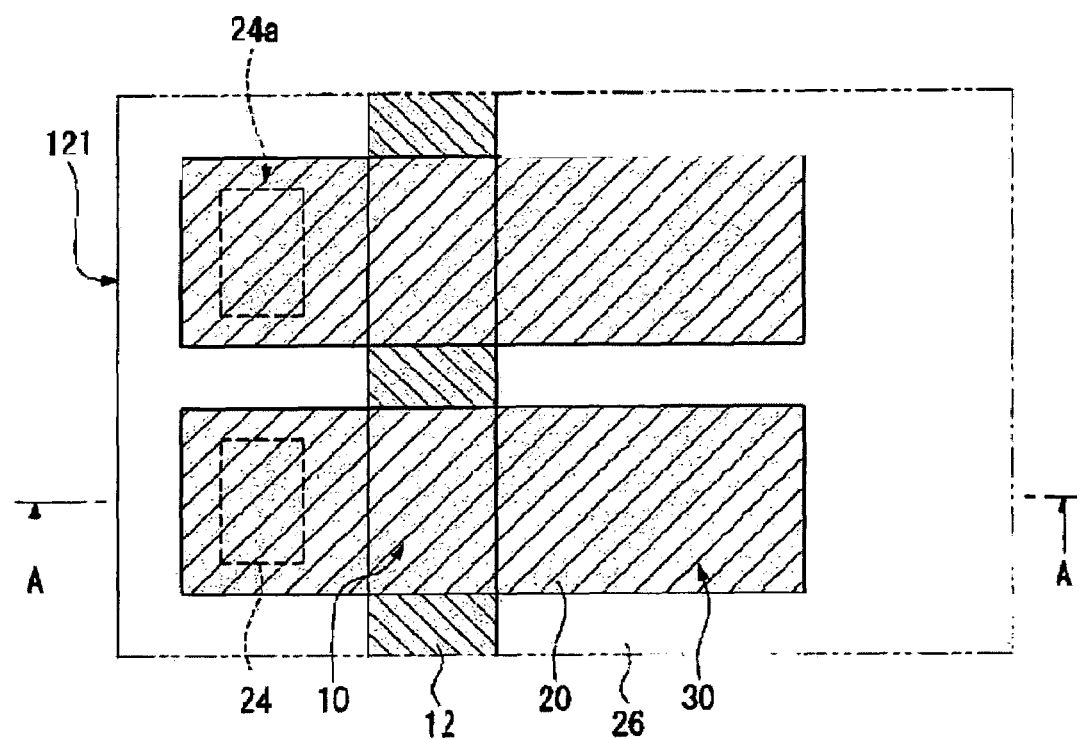
FIG. 1 is an explanatory drawing of the semiconductor device in the first embodiment.

The embodiment of the present invention will now be described with reference to drawings. Here, the scales of each material in the drawings used in the descriptions are modified accordingly so that each material will be recognized.

THE FIRST EMBODIMENT

Figure 1B:
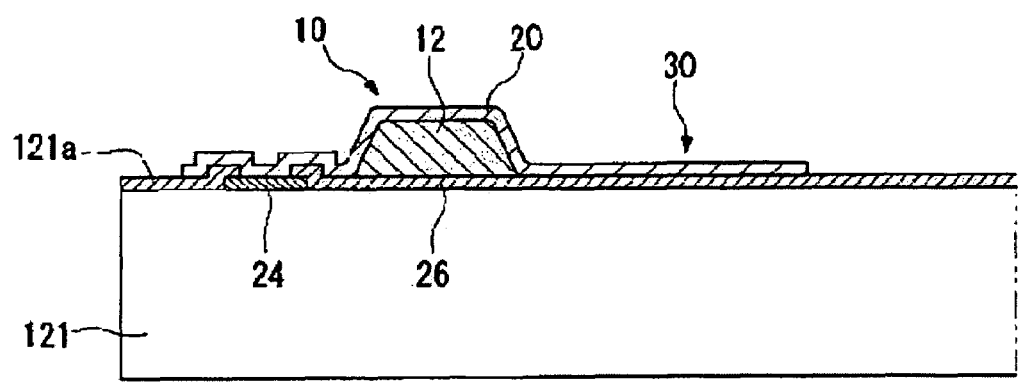
Figure 2:
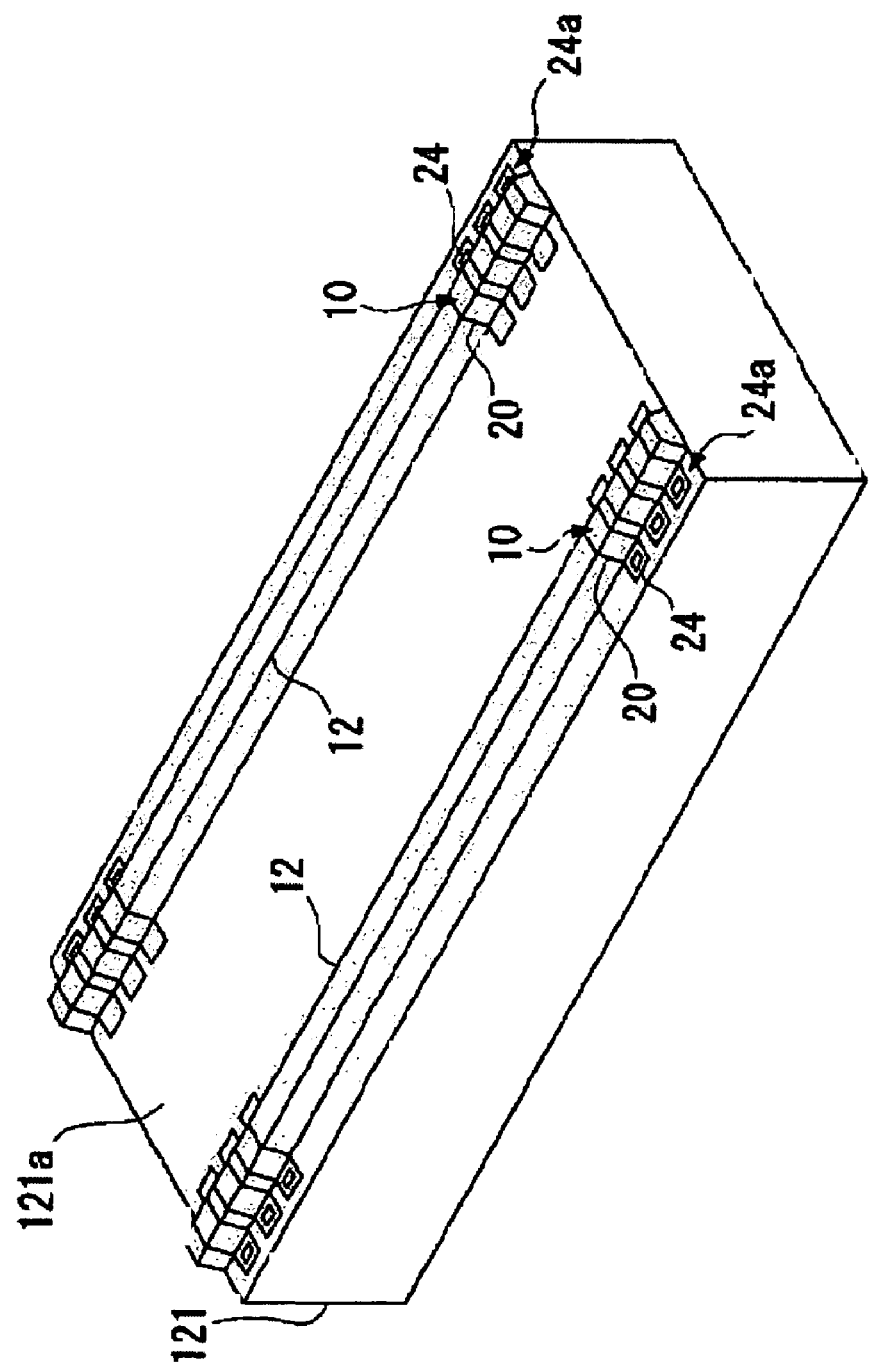
FIG. 2 is an oblique drawing of the semiconductor device in the first embodiment.
Figure 3:
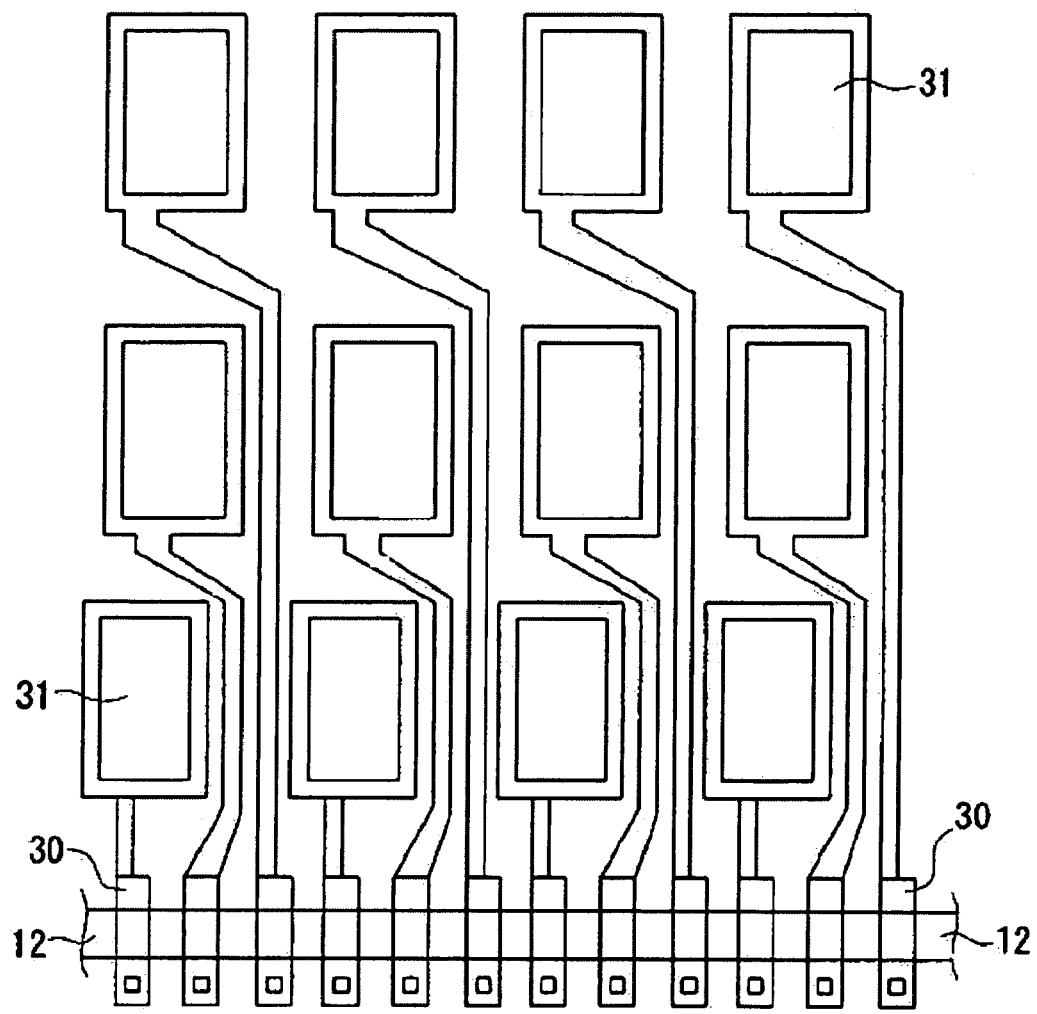
FIG. 3 is an explanatory drawing of the rearranged testing electrode.

First, the first embodiment of the present invention is described using FIG. 1 through FIG. 3.

FIG. 1 is an explanatory drawing of the semiconductor device in the first embodiment. A semiconductor device 121 in the first embodiment includes: an electrode pad 24 and a resin projection 12 formed on an active surface 121a; a conductive film 20 deposited from a surface of the electrode pad 24 to a surface of the resin projection 12; and a resin bump 10 is formed with the resin projection 12 and with the conductive film 20. Further, a testing electrode 30 is formed with the conductive film 20 that is extended and applied to the opposite side of the electrode pad 24.

The Semiconductor Device

FIG. 2 is an oblique drawing of the semiconductor device in the first embodiment. The semiconductor device 121 has, for example, an IC chip that drives the picture element of the liquid crystal display device. Under its active surface, a plurality of electric elements such as a thin film transistor etc., or a wiring that connects each of the electric elements, is formed (neither of them are shown). On the semiconductor device 121 in the first embodiment shown in FIG. 2, the plurality of electrode pads 24 is arranged in alignment along the long side of its active surface 121a. The electrode pad 24 is drawn out from the above-mentioned electronic element, etc. Further, in the inner side of an array of electrode pads 24a on the active surface 121a, the resin projection 12 that continues in a straight line is formed. Moreover, from the surface of each electrode pad 24 to the surface of the resin projection 12, a plurality of conductive films 20 is formed. Consequently, the plurality of resin bump electrodes 10 is composed with conductive film 20, deposited on the surface of the resin projection 12.

FIG. 1A is a magnified top view drawing of the periphery of the resin bump electrode 10, and FIG. 1B is a sectional side view drawing of the section A-A line in FIG. 1A. As shown in FIG. 1B, in the periphery of the active surface 121a of the semiconductor device 121, the plurality of electrode pads 24, composed of a conductive material such as Al etc., is arrayed. On the entire active surface of the semiconductor device 121, the passivation film 26, which includes a dielectric material such as SiN, etc., is formed, and on the surface of each electrode pad 24 mentioned above, the opening of passivation film 26 is formed.

As shown in FIG. 1A, on the surface of the passivation film 26, the resin projection 12 is formed in the inner side of the array of electrode pads 24a. The resin projection 12 has a thin long shape that continues in straight line, and is deposited in parallel to the array of electrode pads 24a. The resin projection 12 is composed with an elastic resin material such as polyimide resin, acrylic resin, phenol resin, epoxy resin, silicon resin, and modified polyimide resin, etc. Here, it is desirable that the resin projection 12 be formed with the photosensitive resin. In this case, the resin projection 12 is formed by coating the photosensitive resin on the surface of the passivation film 26 and then performing photolithography. Consequently, it is possible to position and apply the resin projection 12 with a high precision, in the inner side of the array of electrode pads 24a on the active surface of the semiconductor device 121. Here, as shown in FIG. 1B, it is desirable to perform a photolithography using the gray-mask, so that the section of the resin projection 12 takes a tapered shape, such as a mesa or a semicircle, that enables an easy elastic deformation.

Moreover, from the surface of each electrode pad 24 to the surface of the resin projection 12, a plurality of conductive films 20 is formed. The conductive film 20 is composed with a conductive material, such as Au, TiW, Cu, Ni, Pd, Al, Cr, Ti, W, NiV, etc., or with lead-free solder, etc. Here, the conductive film 20 may have a dual layer structure with TiW/Au, etc. The conductive film 20 is formed, first by forming a conductive film on the entire active surface of the semiconductor device 121 with vapor deposition or sputtering, and then by performing an appropriate patterning process on it.

Here, it is desirable that a metal plating and the like be formed as a reinforcement material on the conductive film 20. More specifically, after forming the conductive film on the entire active surface of the semiconductor device 121, a photoresist is coated, and over it, the opening in the conductive film pattern is formed. Here, it is desirable to deposit the metal plating such as an Au plate etc. with the electroplate method and the like to the resist opening. Thereafter, the resist is stripped, and the conductive film is etched using the deposited metal plating as a mask. Here, whereas the thickness of the conductive film formed by sputtering is, for example, about 0.3 µm, the thickness of the metal plating formed by the electroplate method is, for example, around a few µm. Therefore, the conductive film can be etched while it remains intact. As described above, if the film thickness of the conductive film 20 is increased by plating the surface of the conductive film 20, it is possible to prevent the damage of the conductive film 20 caused by the contact with the test probe, as well as to reduce the electronic resistance of the conductive film 20.

Consequently, the plurality of resin bump electrodes 10 is composed with the plurality of conductive films 20 formed on the surface of the resin projection 12. Here, the thin and long-line-shaped resin projection 12 can be formed with a high precision of height in comparison to a hemispheric resin projection. Thus, by composing the resin bump electrode 10 using the thin and long-line-shaped resin projection 12, it is possible to improve the reliability of the conductive connection with the opposing substrate. Furthermore, because the section of the resin projection 12 takes a tapered shape, it is possible to easily and elastically deform the resin bump electrode. It is therefore possible to improve the reliability of the conductive connection with the opposing substrate.

Each resin bump electrode 10 may also be separated by removing the resin projection 12 residing on the area where the conductive film 20 is not formed, after forming the plurality of conductive films 20 on the resin projection that continues in a straight line. More specifically, by performing a plasma etching using 02 gas as a process gas, the resin projection 12, which resides on the area where the conductive film 20 does not exist, is removed. The conductive film 20, composed of a metallic material, is harder to be dry-etched in comparison to the resin material. Consequently, it is possible to selectively remove only the resin projection 12 at the area where the conductive film 20 is not formed.

Figure 7:
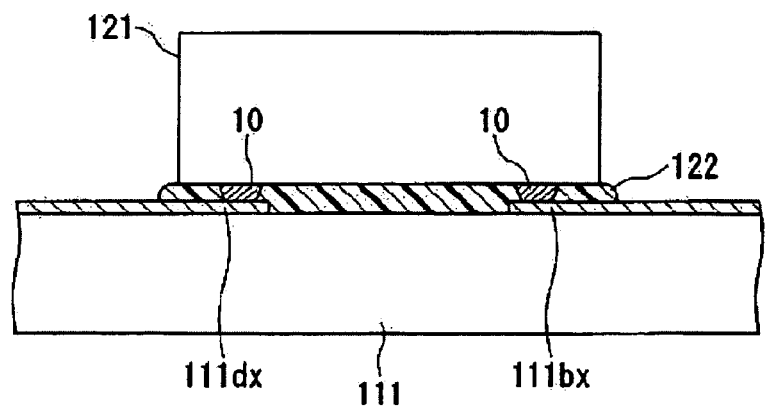
FIG. 7 is an explanatory drawing of the structure wherein the semiconductor device is mounted.

As shown in FIG. 7, the space between the mounted semiconductor 121 and an opposing substrate 111 is sealed by a sealing resin 122 composed with a thermosetting resin. Upon sealing, by removing part of the thin and long-line-shaped resin projection in advance, a flow of the sealing resin 122 can be secured. Consequently, the semiconductor device 121 can be securely mounted to the opposing substrate 111.

Going back to FIG. 1, the testing electrode 30 is formed with the conductive film 20 extended and applied, from the electrode pad 24 to its opposite side across the resin projection 12. In other words, each conductive film 20 is formed, from the surface of each electrode pad 24 at the outer side of the resin projection 12, through the surface of the resin projection 12, until the surface of the passivation film 12 in the inner side of the resin projection 12. Consequently, the plurality of testing electrodes 30 is composed with each conductive film 20 formed in the inner side of the resin projection 12. The testing electrode 30 is used in a way that the test probe described later individually contacts it. Hence, each testing electrode 30 needs to be arranged so that a single test probe does not contact the plurality of adjacent testing electrodes 30 simultaneously.

FIG. 3 is an explanatory drawing of the rearranged testing electrode. In FIG. 3, the testing electrode 30 that is arranged in the inner side of the resin projector 12 is further rearranged in its inner side, and thus the rearranged testing electrode 31 is formed. Here, the testing electrode 30 is arranged in line along the resin projector 12, while the rearranged testing electrode 31 is arranged in multiple arrays. It is therefore possible to enlarge the distance between each adjacent rearranged testing electrode 31, as well as to enlarge the distance of the testing probe. Hence the cost for manufacturing the test probe can be reduced. Here, the rearranged testing electrode 31 has a conductive connection with the testing electrode 30.

Test Method of the Semiconductor Device

Hereafter, the aforementioned testing method of the semiconductor is described using FIG. 1. As the test for the semiconductor device 121, the operation check of electronic elements such as a transistor and the like, that compose the semiconductor device 121 (not shown), as well as the conductive connectivity check between the connecting part with the opposing substrate and the electronic elements, need to be performed. Here, the electrode pad 24 of the semiconductor device 121 is drawn out from the above-mentioned electronic element, etc. In the present embodiment, the above-mentioned operation check as well as the conductive connectivity check, are performed by having the test probe contact the aforementioned plurality of test electrodes 30 (or the rearranged testing electrodes).

In the semiconductor device in the embodiment, the testing electrode 30 formed with the conductive film 20 is extended and applied, from the electrode pad 24 to its opposite side across the resin projection 12. By having the test probe contact this testing electrode 30, the operation check of the electronic element is preformed. Moreover, conductive connectivity check from the resin bump electrode 10, which is a connecting part with the opposing substrate, to the electronic element, is performed. Specifically, in case where there is a disconnection between the resin bump electrode 10 and the electrode pad 24, the disconnection can be detected since the conductive connectivity check is preformed by arranging the testing electrode 30 to its opposite side across the resin projection 12.

Conventionally, various tests have been conducted by having the test probe contact the top part of the resin bump electrode, which is a connecting part with the opposing substrate. However, in the case of the resin bump electrode 10, the conductive film 20 on the surface of the resin projection 12 is formed to be excessively thin. Thus the conductive film 20 on the resin bump electrode 10 may be scratched off by the contact with the test probe. Consequently, the conductive connection between the resin bump 10 and the opposing substrate may not be possible.

Moreover, in the semiconductor device in the aforementioned present embodiment, even if part of the conductive film that composes the testing electrode is scratched off by the contact with the test probe, there is no effect on the conductive function of the semiconductor device. Therefore, it is possible to secure a conductive connection with the opposing substrate.

THE SECOND EMBODIMENT

Hereafter, the semiconductor device in the second embodiment of the present invention is described using FIG. 4.

Figure 4A:
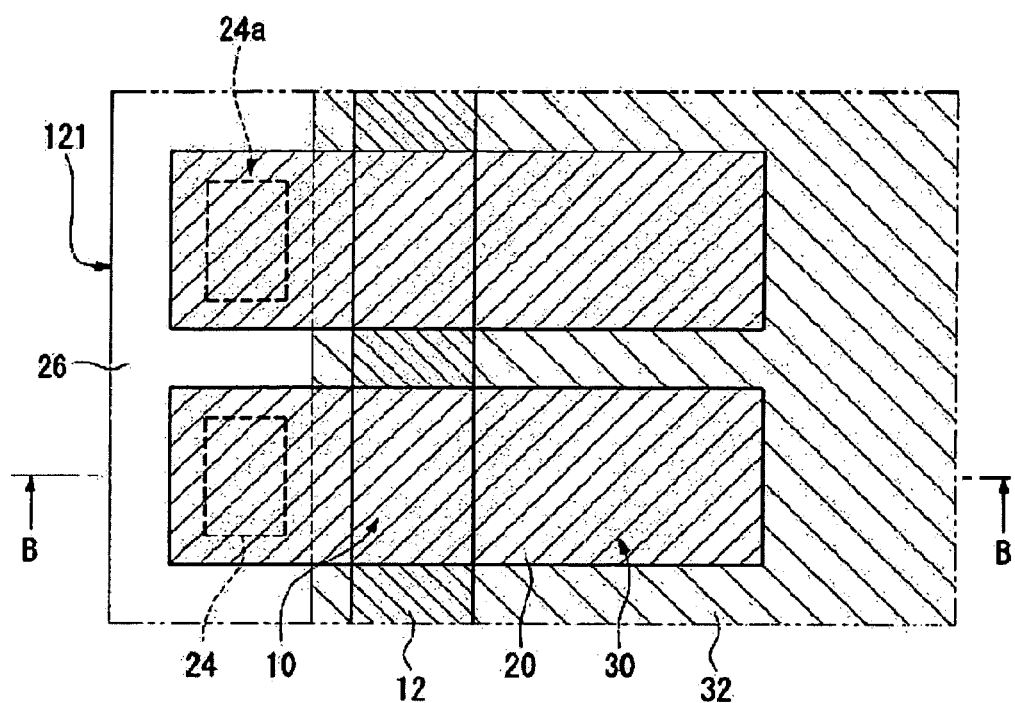
FIG. 4 is an explanatory drawing of the semiconductor device in the second embodiment.
Figure 4B:
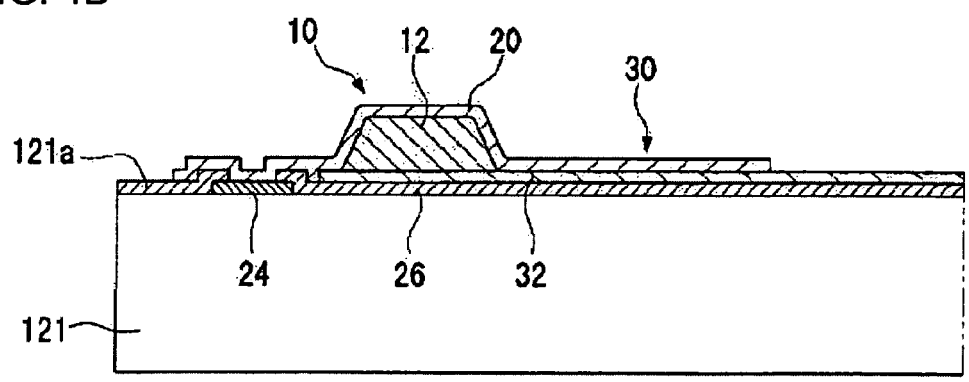

FIG. 4 is an explanatory drawing of the semiconductor device in the second embodiment. FIG. 4A is a magnified top view drawing of the periphery of the resin bump electrode 10, and FIG. 4B is a sectional side view drawing of the section B-B line in FIG. 4A. As shown in FIG. 4, in the semiconductor device 121 in the second embodiment, a resin layer 32 is formed in the inner side of the array of electrode pads 24a on the active surface 121a. On the surface of the resin layer 32, the resin projection 12 is formed. The conductive film 20 is extended and applied, from the electrode pad 24 to its opposite side across the resin projection 12, and the conductive film 20 is deposited on the surface of the resin layer 32. Hence the testing electrode 30 is formed. Here, the detailed description is omitted for the part that has same structure as that of the first embodiment.

On the active surface 121a of the semiconductor device 121, the passivation film 26 is formed. The resin layer 32 is formed in the inner side of the array of electrode pads 24a on the surface of that passivation film 26. The resin layer 32 is composed with an elastic resin material such as polyimide resin, acrylic resin, phenol resin, epoxy resin, silicon resin, and modified polyimide resin, etc. Here, it is desirable that the resin layer 32 be formed with a photosensitive resin. In this case, it is possible to position and apply the resin layer 32 with a high precision in the inner side of the array of electrode pads 24a on the semiconductor device 121.

On the surface of this resin layer 32, the resin projection 12, similar to that of the first embodiment, is formed. By forming the resin layer 32 on the active surface of the semiconductor device, the active surface is flattened. It is therefore possible to secure the high precision of the height of the resin projection 12, by forming the resin projection 12 on the surface of the resin layer 32. By composing the resin bump electrode 10 using this resin projection 12, a conductive connection with the opposing substrate is secured. Here, it is desirable that the resin projection 12 be formed with the same resin material as that of the resin layer 32. In this case, the resin projection 12 and the resin layer 32 adhere to each other, hence it is possible to improve the reliability of the resin bump electrode 10, as well as to secure a conductive connection with the opposing substrate.

Moreover, from the surface of each electrode pad 24 to the surface of the resin projection 12, a plurality of conductive films 20 is formed, and hence the resin bump electrodes 10 are composed. Further, the testing electrode 30 is formed with the conductive film 20 that is extended and applied to the opposite side of the electrode pad 24 across the resin projection 12. That is to say, the testing electrode 30 is formed on the surface of the resin layer 32.

The passivation film 26 is composed of brittle material such as silicon oxide, silicon nitride and the like, thus if the testing electrode is composed by the conductive film formed directly on its surface, the passivation film 26 may be damaged by the shock of the contact between the testing probe and the testing electrode.

In contrast, in case of the semiconductor device in the present embodiment, the conductive film 20 is formed on the surface of the passivation film 26 via the resin layer 32. This resin layer includes an elastic material, and hence it functions as a buffer material against the contact between the probe and the testing electrode. This way, the damage prevention of the passivation film 26 is possible, and hence the reliability of the semiconductor device can be improved.

THE THIRD EMBODIMENT

Hereafter, the semiconductor device in the third embodiment of the present invention is described using FIG. 5.

Figure 5A:
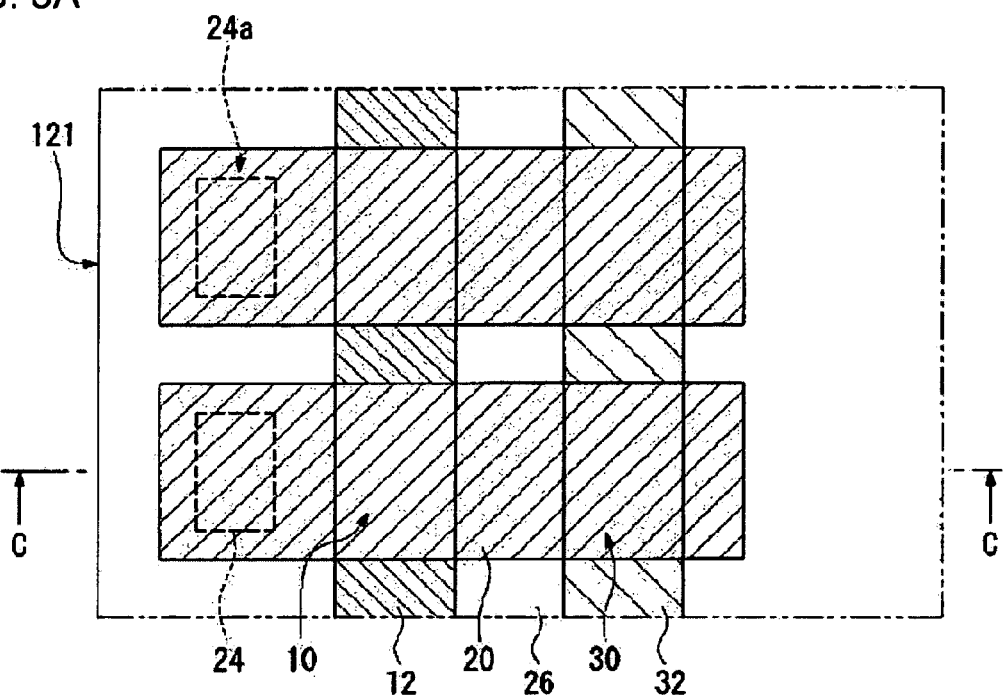
FIG. 5 is an explanatory drawing of the semiconductor device in the third embodiment.
Figure 5B:
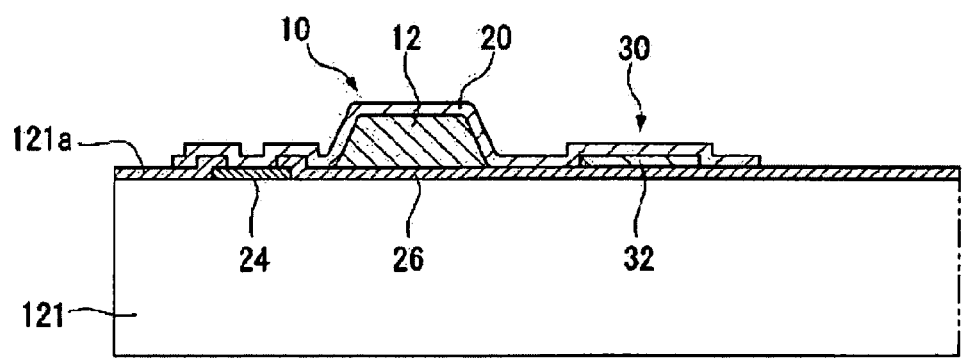

FIG. 5 is an explanatory drawing of the semiconductor device in the third embodiment. FIG. 5A is a magnified top view drawing of the periphery of the resin bump electrode 10, and FIG. 5B is a sectional side view drawing of the section C-C line in FIG. 5A. As shown in FIG. 5, in the semiconductor device 121 in the third embodiment, the resin projection 12 is formed in the inner side of the array of electrode pads 24a on the active surface 121a. The resin layer 32 is formed in the inner side of the resin projection 12 on the active surface 121a. The conductive film 20 is extended and applied, from the electrode pad 24 to its opposite side across the resin projection 12, and that conductive film 20 is deposited on the surface of the resin layer 32. Thus the testing electrode 30 is formed. Here, the detailed description is omitted for the part that has the same structure as that of the first and the second embodiments.

On the active surface 121a of the semiconductor device 121, the passivation film 26 is formed. The resin projection 12 is formed in the inner side of the array of electrode pads 24a on the surface of the passivation film 26. Moreover, in the inner side of the resin projection 12 on the surface of the passivation film 26, the resin layer 32 whose height is lower than the resin projection 12 is formed. The resin layer 32 is formed along the resin projection 12 in a strap-shape. However, it may also be formed from the inner side of the resin projection 12 towards the center part of the active surface continuously. In either case, since the resin layer 32 is formed with an adequate distance from the electrode pad 24, there is no need to form the resin layer 32 with a high precision for making an opening on the surface of the electrode pad 24. Consequently, since it is possible to form the resin layer 32 with a trivial process such as the printing method, the manufacturing cost can be reduced.

Moreover, from the surface of each electrode pad 24 to the surface of the resin projection 12, a plurality of conductive films 20 is formed, and hence the resin bump electrode 10 is composed. Further, the conductive film 20 is extended and applied to the opposite side of the electrode pad 24 across the resin projection 12, and on the surface of the resin layer 32, the conductive film 20 is deposited. Thus the testing electrode 30 is formed.

In the third embodiment, similarly to the second embodiment, the testing electrode is formed on the surface of the passivation film 26 via the resin layer 32, and hence the resin layer 32 functions as a buffer material against the contact between the probe and the testing electrode. Since the damage prevention of the passivation film 26 is possible, the reliability of the semiconductor device can be improved.

Electro-Optic Device

Hereafter, the electro-optic device composed of the semiconductor device in the aforementioned embodiments is described.

Figure 6:
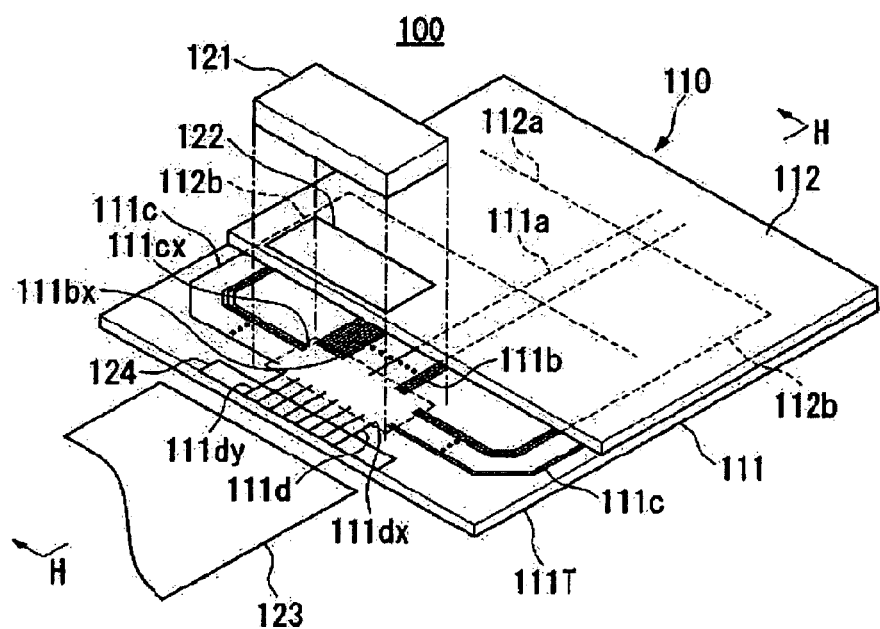
FIG. 6 is a schematic drawing showing a liquid crystal display device, which represents one aspect of the embodiment of the electro-optic device.

FIG. 6 is a schematic drawing showing a liquid crystal display device, which represents one aspect of the embodiment of the electro-optic device. A liquid crystal display device 100 shown here has a liquid crystal panel 110, as well as a semiconductor device 121, which serves as an IC chip for driving liquid crystal. Collateral materials, such as a polarizing plate, a reflection sheet, and a backlight, etc. (not shown), are installed accordingly on demand.

The liquid panel 110 includes the substrate 111 and a substrate 112 composed of glass or plastic, etc. The substrate 111 and the substrate 112 are arranged to face one another, and are adhered to each other with sealing material (not shown). In between the substrate 111 and the substrate 112, the liquid crystal (not shown), which is the electro-optic material, is sealed in. On the internal surface of the substrate 111, an electrode 111a composed of a transparent conductive material such as Indium Tim Oxide (ITO), is formed. On the internal surface of the substrate 112, an electrode 112a, arranged to face the aforementioned electrode 111a, is formed. Here, the electrode 111a and the electrode 112a are arranged orthogonally. Further, the electrode 111a and the electrode 112a are drawn out to an overhang portion of the substrate 111T, and on each end, an electrode terminal 111bx and an electrode terminal 111cx are formed. On the rim vicinity of the overhang portion of the substrate 111T, an input wiring 111d is formed, and on its inner end, a terminal 111dx is formed.

On the overhang portion of the substrate 111T, the semiconductor device 121 is mounted via the sealing resin 122 composed of thermosetting resin in either a soluble state (A-stage) or in a semi-solid state (B-stage). The semiconductor device 121 serves as, for example, the IC chip for driving liquid crystal that drives the liquid crystal panel 110. On the lower surface of the semiconductor device 121, multitudes of resin bump electrodes (not shown) are formed, and those bumps are conductively connected to the terminals 111bx, 111cx, and 111dx residing on the overhang portion of the substrate 111T.

To an input terminal 111dy, formed on the outer end of the input wiring 111d, a flexible wiring substrate 123 is mounted through an anisotropic conductive film 124. The input terminal 111dy is conductively connected to a wiring (not shown) installed on the flexible wiring substrate 123. A control signal, an video signal, and a power electric-potential, etc. are provided through the flexible wiring substrate 123, and the driving signal for driving liquid crystal is generated in the semiconductor device 121, and then is provided to the liquid crystal panel 110.

In the liquid crystal display device 100 in the embodiments composed as above, an appropriate level of voltage is applied between the electrode 111a and the electrode 112a through the semiconductor device 121. Then the electrode 111a and the electrode 112a reorient the liquid crystal in the picture element parts that are arranged to face each other so that the light is modulated. Consequently in the display area where the picture elements inside the liquid crystal panel 110 are arrayed, the desired image is formed.

FIG. 7 is a sectional side view drawing of the section H-H line in FIG. 6, which serves as an explanatory drawing of the structure wherein the semiconductor device 121 is mounted on the above-mentioned liquid crystal display device 100. As shown in FIG. 7, on the active surface of the semiconductor device 121 (lower surface in the drawing), the plurality of resin bump electrodes 10 is installed as a terminal of the IC side, and its tip is in conductive contact directly with the terminal 111bx and the terminal 111dx on the aforementioned substrate 111. In the surrounding area of the conductive contact part between the resin bump electrode 10 and the terminals 111bx, as well as 111dx, the hardened sealing resin 122 that is composed of thermosetting resin, etc. is filled.

Electronic Appliance

Figure 8:
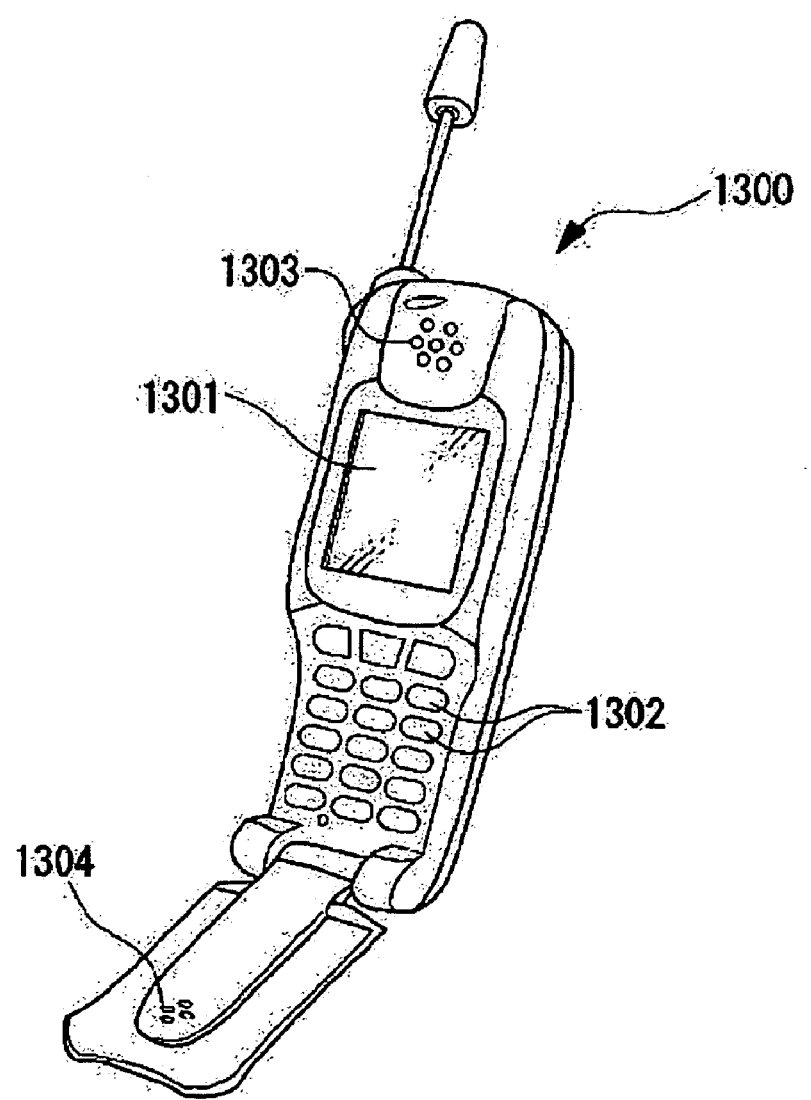
FIG. 8 is an oblique drawing showing an example of the electronic appliance.
Figure 9:
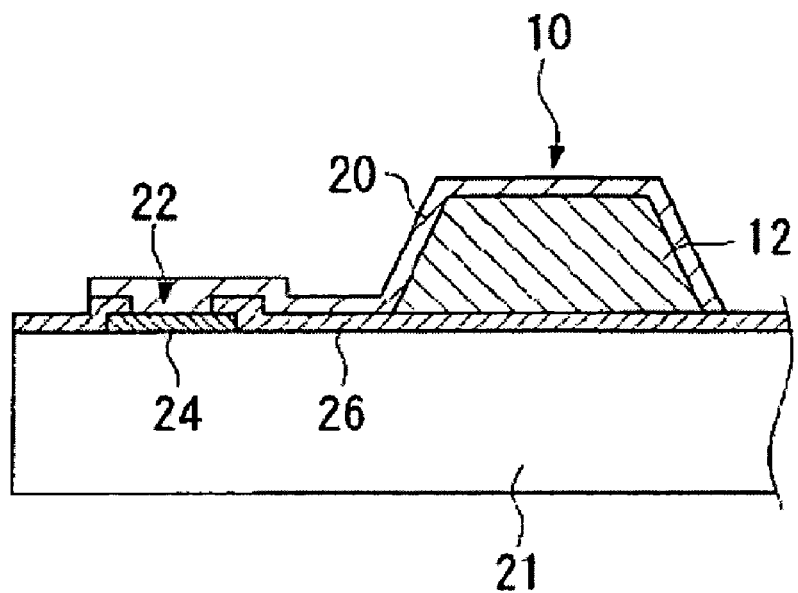
FIG. 9 is an explanatory drawing of a resin bump electrode.

FIG. 8 is an oblique drawing showing an example of the electric appliance in the present invention. A mobile phone 1300 shown in this drawing is structured having the aforementioned electro-optic device as a small-sized display part 1301, as well as a plurality of operation buttons 1302, a receiver 1303, and a transmitter 1304.

The above-mentioned electro-optic device can be suitably used as an image display device, not only as the abovementioned mobile phone, but also as an electronic book, a personal computer, a digital still camera, a liquid crystal display television, a viewfinder type or a direct-view monitor-type video tape recorder, a car navigation device, a pager, an electronic notebook, a calculator, a word processor, a workstation, a videophone, a point-of-sale terminal, or an appliance with touch panel, etc. In either case, an electronic appliance with an excellent electric connection reliability can be provided.

The technological range of the invention shall not be limited to each of the embodiments described above. Embodiments with various modifications to those embodiments, without departing from the main scope of the invention, are also included. That is to say, the specific material and compositions mentioned in each of the embodiments are merely examples. The appropriate modification is possible.

What is claimed is:

1. A semiconductor device comprising:
a resin projection disposed on an active surface;
an electrode pad disposed on the active surface, the electrode pad being arranged to a first side of the resin projection; and
a conductive film extending over the resin projection and on the electrode pad, the conductive film further extending into a region arranged to a second side of the resin projection, the second side of the resin projection being opposite the first side, the conductive film forming a testing electrode in the region arranged to the second side of the resin projection,
wherein the semiconductor device is conductively connected to an opposing substrate via the conductive film.

2. A semiconductor device comprising:

a resin projection disposed on an active surface;

a resin layer formed on the active surface, the resin projection extending further away from that active surface than the resin layer;

an electrode pad disposed on the active surface, the electrode pad being arranged to a first side of the resin projection;

a conductive film extending over the resin projection and on the electrode pad, the conductive film further extending into a region arranged to a second side of the resin projection, the second side of the resin projection being opposite the first side, the conductive film extending on the resin layer and forming a first testing electrode on the resin layer and in the region arranged to the second side of the resin projection; and a second testing electrode arranged to the second side of the resin projection, the second testing electrode being spaced further from the resin projection than the first testing electrode, the second testing electrode being electrically connected to the first testing electrode, wherein the semiconductor device is conductively connected to an opposing substrate via the conductive film.

3. The semiconductor device according to claim 2, wherein the resin projection is formed on the surface of the resin layer.

4. The semiconductor device according to claim 2, wherein the resin projection and the resin layer are formed with the same resin material.

5. The semiconductor device according to claim 2, wherein the resin projection and/or the resin layer is formed with a photosensitive resin.

6. The semiconductor device according to claim 1, wherein the conductive film is formed with a spattering method, and is patterned by an etching method.

7. The semiconductor device according to claim 1, wherein a reinforcement material for the conductive film is formed on the surface of the conductive film with a conductive material.

8. A circuit substrate whereon the semiconductor device according to claim 1 is mounted.

9. An electro-optic device comprising the semiconductor device according to claim 1.

10. An electro-optic device comprising the circuit substrate according to claim 8.

11. An electronic appliance comprising the circuit substrate according to claim 8.

12. An electronic appliance comprising the electro-optic device according to claim 9.

* * * * *